United States Patent
Lee et al.

(10) Patent No.: US 7,470,491 B2
(45) Date of Patent: *Dec. 30, 2008

(54) METHOD OF FABRICATING COLOR FILTER PANEL USING BACK EXPOSURE AND STRUCTURE OF COLOR FILTER PANEL

(75) Inventors: Dong-Hoon Lee, Gyungsangbuk-Do (KR); Byoung-Ho Lim, Gyungsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 560 days.

This patent is subject to a terminal disclaimer.

(21) Appl. No.: 10/826,274

(22) Filed: Apr. 19, 2004

(65) Prior Publication Data

US 2005/0095514 A1    May 5, 2005

(30) Foreign Application Priority Data

Nov. 5, 2003    (KR) .................... 10-2003-0078046

(51) Int. Cl.
*G02F 1/13*    (2006.01)

(52) U.S. Cl. .......................... 430/7; 430/321

(58) Field of Classification Search .............. None
See application file for complete search history.

(56) References Cited

U.S. PATENT DOCUMENTS

| | | | |
|---|---|---|---|
| 5,712,065 A | 1/1998 | Chiang | |
| 5,925,484 A | 7/1999 | Shima et al. | |
| 6,147,729 A | 11/2000 | Kurauchi et al. | |
| 6,323,921 B1 | 11/2001 | Kurauchi et al. | |
| 6,392,735 B1 | 5/2002 | Tani | |
| 6,577,374 B1 | 6/2003 | Nakata et al. | |
| 7,123,333 B2 * | 10/2006 | Lee et al. | 349/156 |
| 2001/0007733 A1 | 7/2001 | Matsuyama et al. | |

FOREIGN PATENT DOCUMENTS

| | | |
|---|---|---|
| JP | 7-181316 A | 7/1995 |
| JP | 8-95021 A | 4/1996 |
| JP | 9-197120 A | 7/1997 |
| JP | 9-230124 A | 9/1997 |
| JP | 10-160927 A | 6/1998 |
| JP | 10-197713 A | 7/1998 |
| JP | 10-221696 A | 8/1998 |
| JP | 10-239513 A | 9/1998 |
| JP | 11-212076 A | 8/1999 |
| JP | 2000-29206 A | 1/2000 |
| JP | 2000-75305 A | 3/2000 |

(Continued)

OTHER PUBLICATIONS

Computer-generated translation of JP 7-181316 (Jul. 1995).*

*Primary Examiner*—John A. McPherson
(74) *Attorney, Agent, or Firm*—Birch, Stewart, Kolasch & Birch, LLP (57) ABSTRACT

A fabrication method of a color filter panel of a display device and the structure of the color filter panel are provided. The method includes forming a color filter layer on a substrate where the color filter layer defines an opening, forming a photosensitive layer on the color filter layer, and forming a spacer by back-exposing the photosensitive layer through the opening.

19 Claims, 7 Drawing Sheets

FOREIGN PATENT DOCUMENTS

| | | | |
|---|---|---|---|
| JP | 2000-089233 A * | 3/2000 | |
| JP | 2001-108815 A | 4/2001 | |
| JP | 2002-131902 A | 5/2002 | |
| JP | 2002-236210 A | 8/2002 | |
| JP | 2003-15294 A | 1/2003 | |
| JP | 2003-177228 A | 6/2003 | |

* cited by examiner

METHOD OF FABRICATING COLOR FILTER PANEL USING BACK EXPOSURE AND STRUCTURE OF COLOR FILTER PANEL

The present application claims, under 35 U.S.C. § 119, the priority benefit of Patent Application No. 2003-78046 filed in Republic of Korea on Nov. 5, 2003, the entire contents of which are herein fully incorporated by reference.

BACKGROUND OF THE INVENTION

1. Field of the Invention

The present invention relates to a fabrication method of a liquid crystal display (LCD) device, and more particularly, to a fabrication method of a color filter panel using a reduced number of mask processes.

2. Description of the Related Art

Generally, an LCD device is for displaying an image by using a liquid crystal driven by an applied signal, and is largely composed of an upper plate, a lower plate, and a liquid crystal between the upper and lower plates.

The upper plate is generally known as a color filter panel or substrate for displaying an image in colors. The lower plate is generally known as a thin film transistor (TFT) array panel or substrate having unit pixels arranged in a matrix form and provided with TFTs at each unit pixel as a switching device.

The structure of an LCD panel constituted with an upper plate 200 and a lower plate 100 will be explained with reference to FIG. 1.

Figure 1:
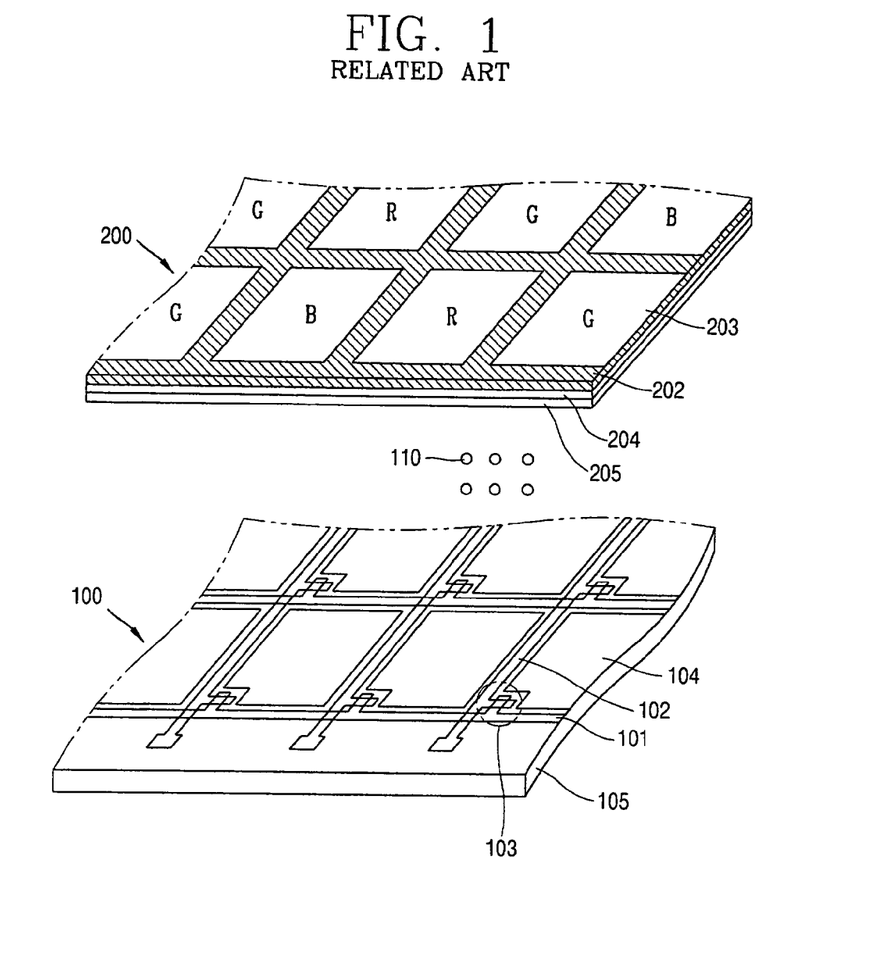
FIG. 1 is a perspective view showing a schematic construction of a liquid crystal display (LCD) device in accordance with the related art.

As shown in FIG. 1, in the lower plate (TFT array panel) 100, a plurality of gate lines 101 arranged in parallel cross perpendicularly a plurality of data lines 102 arranged in parallel on a lower substrate 105. Intersection regions between the gate lines 101 and the data lines 102 are defined as unit pixel regions, where the unit pixel regions are arranged in a matrix form on the lower substrate 105. At each intersection region between the gate lines 101 and the data lines 102, a switching device 103 for driving the corresponding unit pixel is formed. As the switching device, a TFT is generally used. The TFT includes a gate electrode, a source electrode, a drain electrode, and a channel layer. The gate electrode and the source/drain electrodes are respectively connected to the corresponding gate line 101 and the corresponding data line 102.

For each unit pixel region, a pixel electrode 104 for applying an electric field to a liquid crystal 110 is formed at the lower substrate 105. An alignment layer (not shown) for the initial alignment of the liquid crystal 110 is formed on the pixel electrodes 104 over the entire surface of the lower substrate 105. As the alignment layer, a polyimide-based organic layer is used. The initial alignment of the liquid crystal 110 is performed by depositing the alignment layer and performing a rubbing process for rubbing the alignment layer with cotton.

A spacer (not shown in FIG. 1) for evenly maintaining a gap between the lower plate 100 and the upper plate 200 is arranged on the alignment layer. A sealant for bonding the upper plate 200 and the lower plate 100 and preventing the liquid crystal 110 from being leaked is formed at the periphery of the pixel region of the lower plate 100.

The structure of the upper plate 200 opposing the lower plate 100 and displaying information in colors will be explained.

In the upper plate 200, a black matrix 202 for shielding unnecessary light among the light irradiated from the lower plate 100 is provided in a matrix form. On the black matrix 202, a color filter layer 203 for displaying an image in colors is provided. The color filter layer 203 is composed of R, G, and B sub color filter layers each corresponding to one of the unit pixel regions.

An overcoat layer 204 for compensating any step in the color filter layer 203 may be provided on the color filter layer 203. A common electrode 205 for applying an electric field to the liquid crystal 110 with the pixel electrodes 104 formed at the lower plate 100 is provided on the overcoat layer 204. On the common electrode 205, an alignment layer (not shown) for the initial alignment of the liquid crystal 110 is provided. A spacer (not shown) for maintaining a cell gap between the upper plate 200 and the lower plate 100 may be provided on this alignment layer. As known, a spacer can be provided either at the upper plate 200 or at the lower plate 100.

Figure 2:
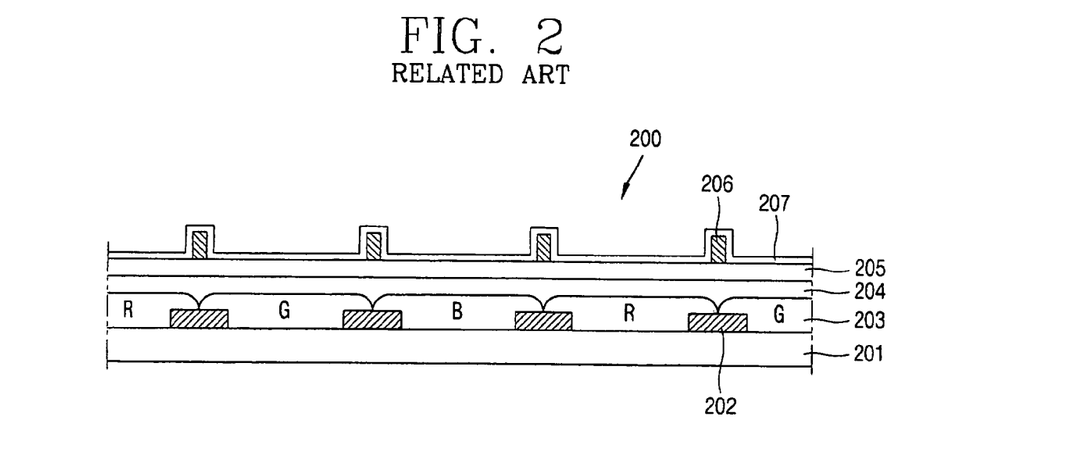
FIG. 2 is a sectional view showing the structure of the color filter panel of the LCD device of FIG. 1.

FIG. 2 shows the structure of the upper plate (color filer panel) 200 of the LCD device of FIG. 1 in more detail.

Referring to FIG. 2, on a color filter substrate 201 of a transparent material, the black matrix 202 is provided. The black matrix 202 is formed of a metal thin film or a resin, and is arranged in a matrix form so as to correspond to the gate lines 101 and data lines 102 formed on the lower substrate 105. A color resin as the color filter layer 203 for displaying an image in colors is formed in a pixel region defined by the black matrix 202. The color resin is composed of R, G, and B colors, and is arranged to correspond to each unit pixel. On the color filter layer 203, the transparent overcoat layer 204 for compensating steps in the color filter layer 203 and protecting the color filter layer 203 is provided. On the overcoat layer 204, the common electrode 205 composed of a transparent material for applying an electric field to the liquid crystal 110 is provided. On the common electrode 205, a spacer 206 for maintaining a cell gap of the LCD device is formed. On the spacer 206, an alignment layer 207 for the initial alignment of the liquid crystal 110 injected between the color filter panel 200 and the TFT array panel 100 is provided.

The fabrication process of the color filter panel 200 of FIG. 2 will be explained in more detail with reference to FIGS. 3A to 3D.

Figure 3A:
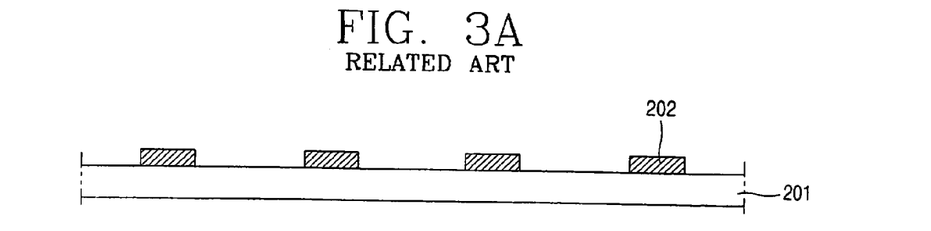
FIGS. 3A to 3D are views showing the fabrication process of the color filter panel of FIG. 2.

Generally, a metal material or a resin for forming a black matrix is formed on a transparent substrate. The black matrix is formed between R, G, and B sub color filter layers and shields light passing through a reverse tilt domain formed at the periphery portion of a pixel electrode of a TFT array panel. As the material of the black matrix, a metal thin layer such as Cr having an optical density more than 3.5 or an organic material such as carbon are generally used. A double layer such as Cr/CrOx may be used for a low reflection. In case of using a metal thin layer, the black matrix may be formed in a certain pattern by a photolithography process applying an exposure process using a mask. On the other hand, in case of using a resin of an organic material, the black matrix may be formed in a certain pattern by an exposure process using a mask and a development process.

More specifically, FIG. 3A shows the black matrix 202 of a certain pattern formed on the substrate 201. In order to form the black matrix 202 on the substrate 201, a first mask including a black matrix pattern is needed and used.

Figure 3B:
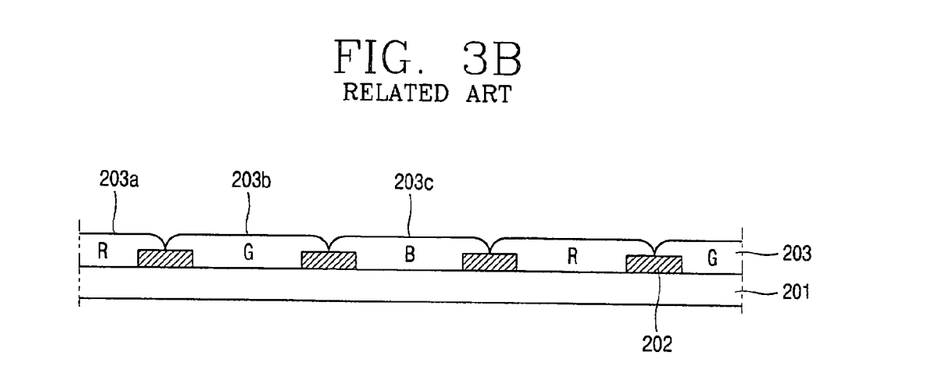

After forming the black matrix 202, as shown in FIG. 3B, the color filter layer 203 composed of R, G, and B colors for displaying an image in colors is formed. The color filter layer 203 composed of R, G, and B sub color filter layers is formed such that each sub color filter layer corresponds to one of the unit pixels. The color filter layer 203 can be fabricated by using one of several methods such as a dyeing method, an electrodepositing method, a pigment dispersing method, a printing method, etc. Herein, the fabrication method of the color filter layer 203 by using the pigment dispersing method will be explained.

According to the pigment dispersing method, first, one of R, G, and B color resins is deposited on the substrate 201 where the black matrix 202 is formed. Here the color resins are deposited in the order of R, G, and B. Then, a selective exposure is performed on the resulting structure thereby to form a red sub color filter layer 203a. Then, a green color resin is deposited on the substrate 201 having the red sub color filter layer 203a, and a selective etching is performed thus to pattern and form a green sub color filter layer 203b at a corresponding region. Then a blue color resin is deposited and selectively etched to form a blue sub color filter layer 203c.

In this regard, the sub color filter layers 203a, 203b, 203c are formed to have the same pattern. As a result, all the sub color filter layers 203a, 203b, 203c are formed by using one same mask having a certain pattern. This involves moving the same mask to a predetermined distance for each sub color filter layer and applying the mask process to form each of the sub color filter layers 203a, 203b, 203c. Consequently, to form the color filter layer 203, the mask process of exposure, development and cleaning has to be performed three times.

Figure 3C:
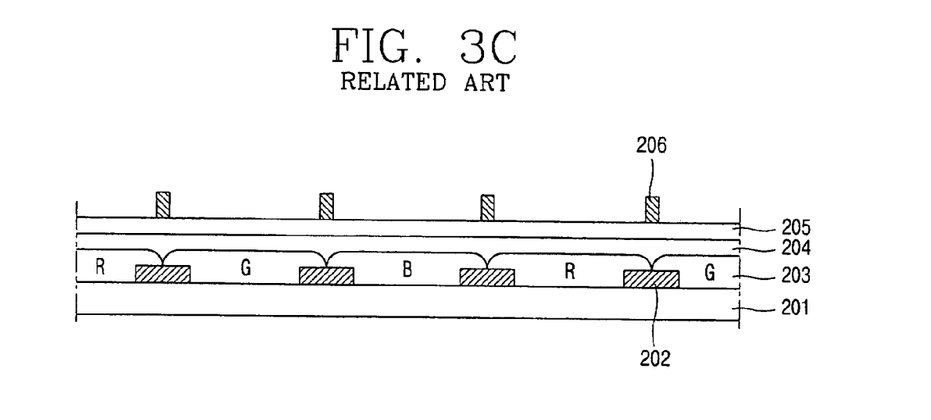

After forming the color filter layer 203 by performing the mask process three times, as shown in FIG. 3C, the transparent overcoat layer 204 of an organic layer for compensating the steps in the color filter layer 203 is formed.

After forming the overcoat layer 204, a transparent electrode as an indium tin oxide (ITO) layer for applying an electric field to the liquid crystal 110 is formed. This ITO layer serves as the common electrode 205.

Figure 3D:
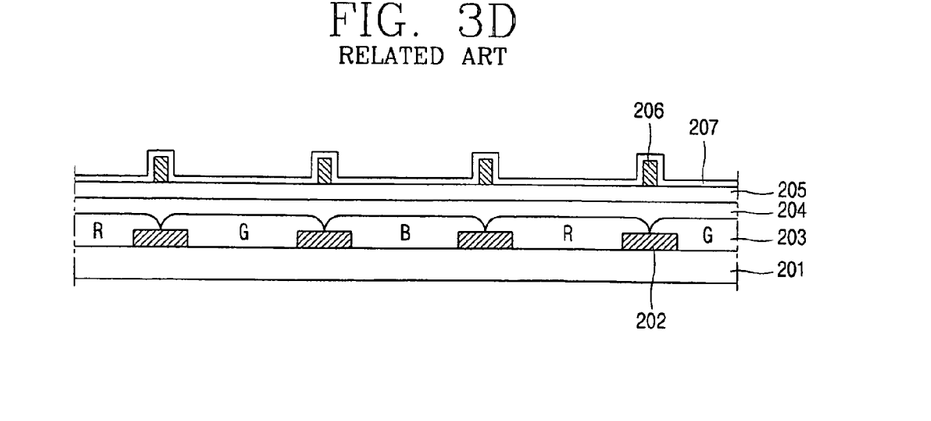

Then, the spacer 206 for constantly maintaining a cell gap of the LCD device is formed on the common electrode 205. The spacer 206 is formed by using a dispersion method for dispersing spacer balls on the substrate or by using a patterning method which can be used to vary the size, height and position of the spacer.

The dispersion method is divided into a wet dispersion method for dispersing the spacer by mixing with alcohol, and a dry dispersion method for dispersing only the spacer. The dry dispersion method includes a static dispersion method using static electricity and an antistatic dispersion method using gas pressure. The antistatic dispersion method is mainly used in the liquid crystal cell structure susceptible to static electricity. By the dispersion method, the size, the height, and the position of the dispersed spacer balls cannot be easily varied. Accordingly, a patterned spacer (also called a column spacer) for increasing an opening ratio is used.

According to the patterning method for the spacer 206, a photosensitive resin is deposited on the common electrode 205 and an exposure process using a mask, a development process, and a cleaning process are performed thereto to form the spacer 206 of a certain pattern. Thus, to form the spacer 206, additional mask processes are required.

After forming the spacer 206 on the common electrode 205, an organic layer such as polyimide is deposited thereon for the initial alignment of the liquid crystal, and a rubbing is performed in a certain direction thus to form the alignment layer 207. This completes the fabrication of the color filter panel of the LCD device.

However, as aforementioned, since a large number of mask processes are required at the time of fabricating the related art color filter panel, the processes are delayed and the productivity of the LCD device is reduced. One mask process includes a series of processes such as a deposition process of a photosensitive resin, an exposure process, a cleaning process, etc. Therefore, it is advantageous to reduce the number of mask processes needed, so as to reduce the fabrication cost of the LCD device and to enhance the productivity of the LCD device.

SUMMARY OF THE INVENTION

Therefore, an object of the present invention is to provide a fabrication method of a color filter panel of an LCD device capable of simplifying processes by reducing the number of masks used and capable of reducing the fabrication cost.

To achieve these and other advantages and in accordance with the purpose of the present invention, as embodied and broadly described herein, there is provided a fabrication method for a color filter panel of a display device, the method comprising: forming a color filter layer on a substrate, the color filter layer defining an opening; forming a photosensitive layer on the color filter layer; and forming a spacer by back-exposing the photosensitive layer through the opening.

According to another aspect of the present invention, there is provided a color filter panel for a display device, the color filter panel comprising: a color filter layer on a substrate and defining an opening to be used to form a spacer; a black matrix on the substrate; and the spacer on the substrate and located above the opening.

According to another aspect of the present invention, there is provided a display device comprising: a thin film transistor (TFT) array panel; a color filter panel; and a liquid crystal between the TFT array panel and the color filter panel, wherein the color filter panel includes a color filter layer on a substrate and defining an opening to be used to form a spacer, a black matrix on the substrate, and the spacer on the substrate and located above the opening.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Hereinafter, a fabrication method of a color filter panel of a display device such as an LCD device according to the present invention will be explained with reference to FIGS. 4 to 7C.

Figure 4:
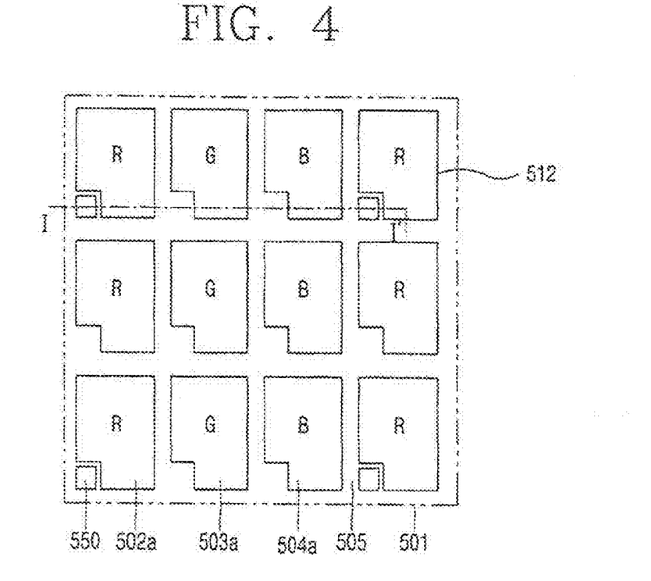
FIG. 4 is a plane view showing a color filter panel of an LCD according to an embodiment of the present invention.

FIG. 4 is a top plane view showing a color filter panel of an LCD device according to one embodiment of the present invention.

Referring to FIG. 4, first (red), second (green), and third (blue) sub color filter layers 502a, 503a and 504a of a color filter layer 512 are formed to correspond to unit pixel regions of a TFT array panel of the LCD device and are arranged alternatingly in a matrix form with a certain distance between the sub color filter layers 502a, 503a, and 504a. The locations in the color filter panel at where the first, second and third sub color filter layers 502a, 503a, and 504a are formed are also referred to herein as first, second and third color filter regions 610, 620 and 630 (FIG. 5), respectively, and these color filter regions correspond to the unit pixel regions of the TFT array panel.

A plurality of openings 550 used to form a spacer are formed at predetermined position(s) of a black matrix region. In the present invention, a spacer means one or more spacer parts such as projections, and the spacer can have various patterns, shapes and sizes. Further, although the first, second and third sub color filters 502a, 503a and 504a are shown to be red (R), green (G) and blue (B) color filters, respectively, this order can be changed and also different colors can be used if needed.

In the present embodiment as illustrated, the openings 550 are formed near some or all of the red sub color filter layers 502a, but can be formed near other sub color filter layers. If the openings 550 are formed to be adjacent to particular sub color filter layers, the openings 550 can be simultaneously fabricated with the formation of the sub color filter layers by using the same masks used to form the sub color filter layers.

Figure 5:
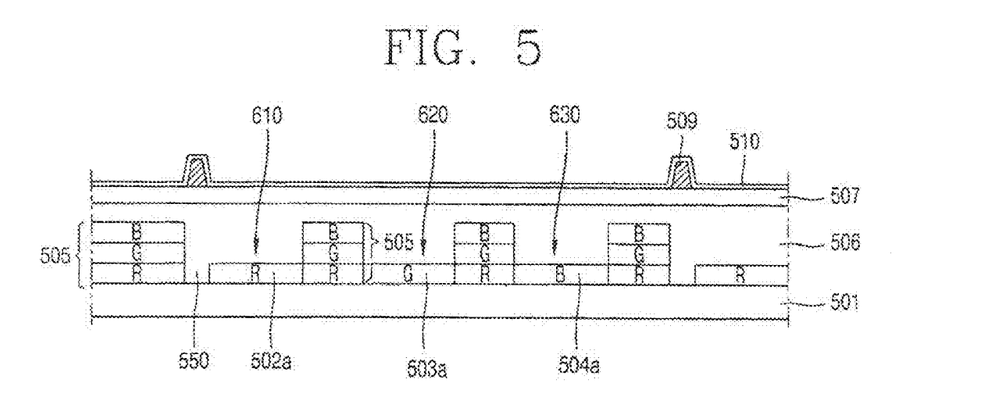
FIG. 5 is a sectional view of the color filter panel taken along line I-I' of FIG. 4.

FIG. 5 is a sectional view of the color filter panel taken along line I-I' of FIG. 4 according to the present invention.

Referring to FIG. 5, the R, G, and B sub color filter layers 502a, 503a, and 504a are arranged with a certain distance therebetween on the substrate 501. Between these sub color filter layers, a black matrix 505 in a matrix format is formed by stacking the R, G, and B sub color filter layers. An overcoat layer 506 for compensating any step in the black matrix 505 is formed on the sub color filter layers 502a, 503a and 504a. A common electrode 507 for applying an electric field to a liquid crystal of the LCD device is formed on the overcoat layer 506. Then a spacer 509 for maintaining a cell gap of the LCD device, and an alignment layer 510 for the initial alignment of the liquid crystal are formed thereon.

The openings 550 are formed by selectively removing the sub color filter layers 502a, 503a, and 504a. The spacer 509 is formed by providing a layer being photosensitized by a light irradiated through the openings 550 by back-exposing the substrate 501 with the light. The back-exposure is performed by using ultraviolet rays. Since the spacer 509 is formed by the back-exposure, the color filter layer 512 may include an ultraviolet ray absorbent material or layer which prevents the ultraviolet rays from passing through the color filter layer 512 at the time of the back-exposure. In this regard, the ultraviolet rays irradiated onto the color filter layer 512 are absorbed by the ultraviolet ray absorbent material/layer, while being irradiated onto the spacer-forming photosensitive resin only through the openings 550. The black matrix 505 also blocks out the ultraviolet rays so as to prevent the rays from passing therethrough.

In another example, the back-exposure may be performed by using a glass filter for passing only a certain wavelength and without the use of the ultraviolet ray absorbent material in the color filter layer. For instance, a glass filter is placed below the substrate and is back-exposed. The glass filter passes the rays having a wavelength of less than 360 nm in the ultraviolet ray region so as to shield or block out the near blue wavelength of 360 nm or above in the ultraviolet ray region. Since the organic layer for forming the spacer 509 includes initiators that react to the light having a wavelength in the range, e.g., 320 nm~360 nm, the filter glass is used to shield the light of at least 360 nm in the ultraviolet ray region to prevent certain portions of the organic layer from reacting to the ultraviolet rays, so as to pattern the spacer 509.

The fabrication process of the color filter panel will be explained with reference to FIGS. 6A to 6I and FIGS. 7A to 7C. FIGS. 6A to 6I show the fabrication process of the color filter panel of FIGS. 4 and 5 according to an embodiment of the present invention, and FIGS. 7A to 7C show an example of masks which can be used to form the sub color filter layers of FIGS. 4 and 5 according to an embodiment of the present invention.

Figure 6A:
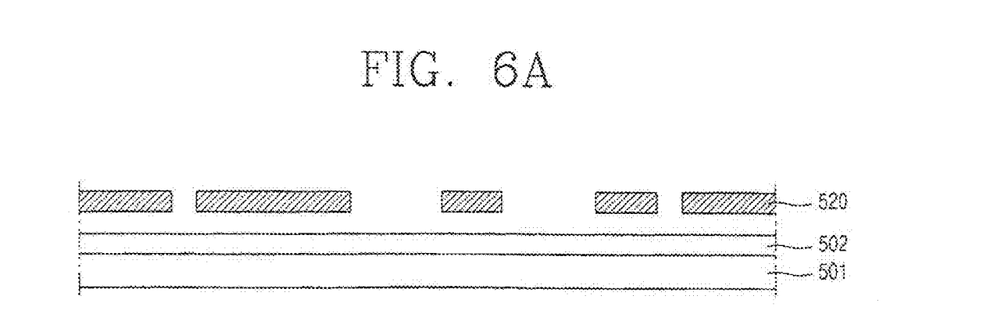
FIGS. 6A to 6I are views showing a fabrication process of the color filter panel of FIG. 5 according to the present invention.

As shown in FIG. 6A, a first organic layer 502 for forming the first sub color filter layer 502a is deposited on the transparent substrate 501. After depositing the first organic layer 502, an exposure process is performed on the first organic layer 502 by using a first mask 520 including a predetermined pattern for forming the first sub color filter layer on the substrate 501.

Figure 7A:
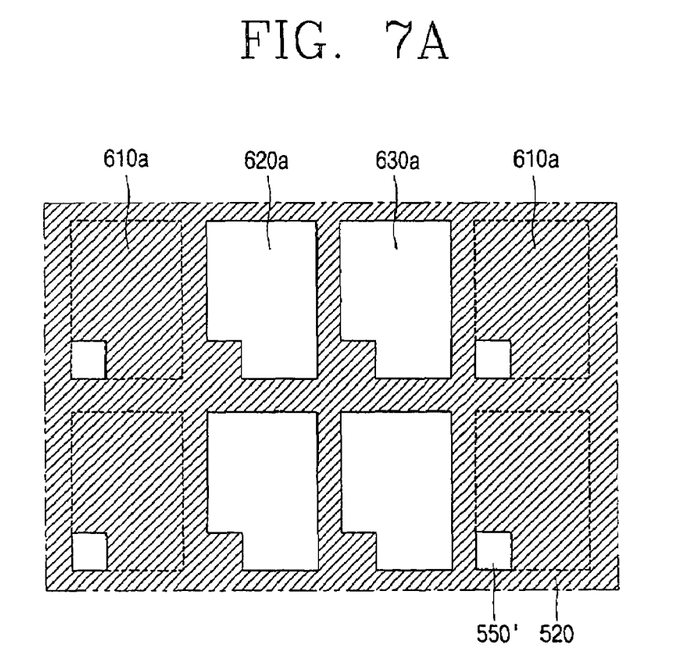
FIGS. 7A to 7C are top plane views showing an example of masks which can be used to form the color filter panel according to the present invention.
Figure 7B:
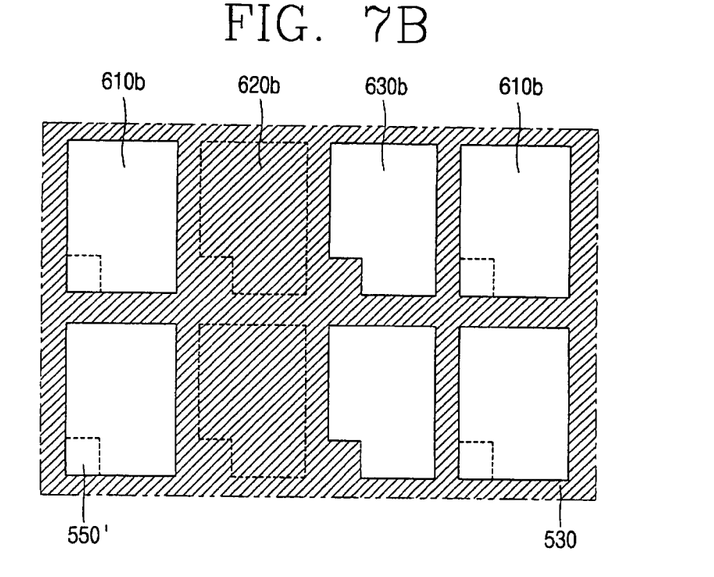
Figure 7C:
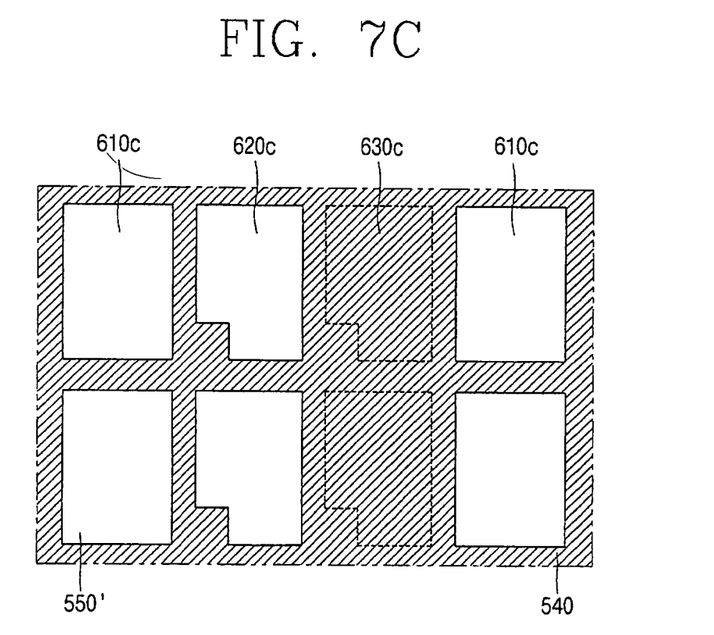

FIG. 7A is a top plane view of an example of the mask pattern 520. As shown in FIG. 7A, the mask 520 includes first, second and third mask regions 610a, 620a and 630a which correspond respectively to the first, second and third color filter regions 610, 620 and 630 of the color filter layer 512 to be formed. To form the first sub color filter layer 502a, the second and third mask regions 620a and 630a of the mask 520 are transmissive so as to transmit a light therethrough and thus to remove, in the development process, portions of the first organic layer 502 that are deposited at the second and third color filter regions 620 and 630. The mask 520 further includes an opening pattern 550' for forming the openings 550 in the color filter panel. The opening pattern 550' corresponds to the pattern of the openings 550. In this example, the opening pattern 550' has a hole-shaped transmissive area that correspond to the location of the openings 550 to be formed, e.g., adjacent the first sub color filter layers 502a.

Figure 6B:
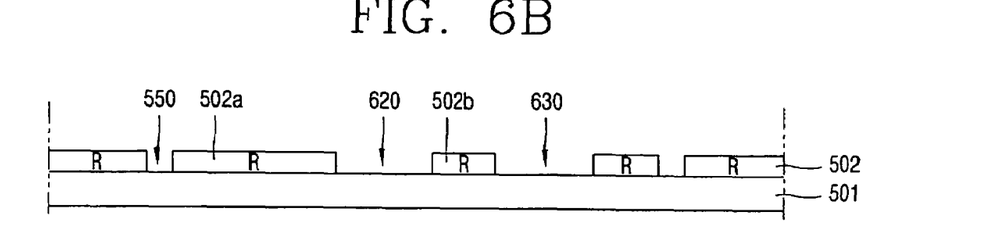

By applying the mask 520, the first organic layer 502 formed on the substrate is selectively exposed to the light through the transmissive areas of the mask 520. In this example, the first organic layer 502 is a positive photosensitive layer such that an exposed region of the first organic layer 502 is removed at the development process. Therefore, according to the pattern of the mask 520, portions of the first organic layer 502 that correspond to the openings 550 and the second and third color filter regions 620 and 630 are selectively removed at the development process. After the development process, the first organic layer 502 remaining on the substrate 501 is heated at a furnace of a high temperature, so that a solvent included in the first organic layer 502 is removed. As a result, as shown in FIG. 6B, except for in the openings 550 and at the second and third color filter regions 620 and 630, the first organic layer 502 as the first sub color filter layer 502a and a first black matrix part 502b is formed using the mask 520.

Figure 6C:
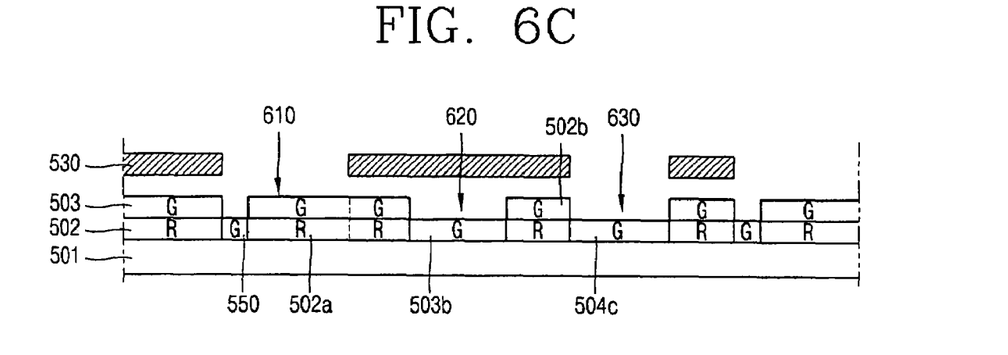

Then, as shown in FIG. 6C, a second photosensitive organic layer 503 (positive type) having a green pigment is formed on the entire resultant substrate including the first sub color filter layer 502a and the first black matrix part 502b. As a result, in the openings 550 and at the second and third color filter regions 620 and 630, only the second organic layer 503 is formed. On the rest of the structure, a stacked layer of the first organic layer 502 and the second organic layer 503 is formed.

After forming the second organic layer 503, as shown in FIG. 6C, the second organic layer 503 is exposed to a light by using a second patterned mask 530 for exposing the first and third color filter regions 610 and 630. FIG. 7B shows an example of the mask 530 which includes the opening pattern 550' integrated into the rest of the pattern of the mask 530. As shown in FIG. 7B, the mask 530 also includes first, second and third mask regions 610b, 620b and 630b which correspond respectively to the first, second and third color filter regions 610, 620 and 630 of the color filter layer 512. The first and third mask regions 610b and 630b are transmissive.

Figure 6D:
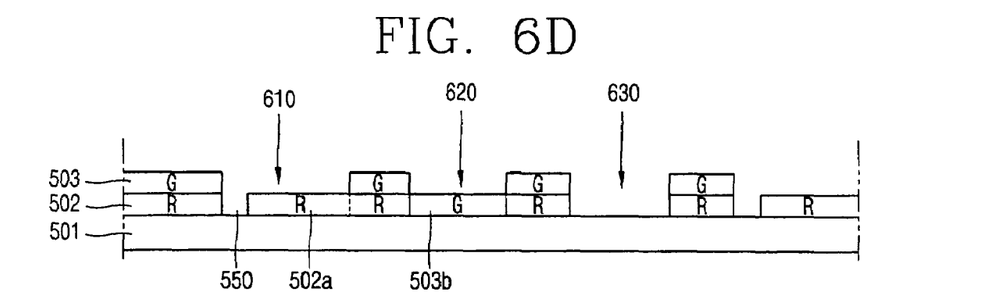

By applying the mask 530, the second organic layer 503 is selectively exposed and developed, whereby the second organic layer 503 is selectively removed from the area of the holes 550 and from the first and third color filter regions 610 and 630 as shown in FIG. 6D. Then the second organic layer 503 remains as a second black matrix part 503b and the second sub color filter layer 503a. After selectively removing the second organic layer 503, the remaining second organic layer 503 is heated at the furnace thus to remove the used solvent and to harden the remaining second organic layer 503.

Figure 6E:
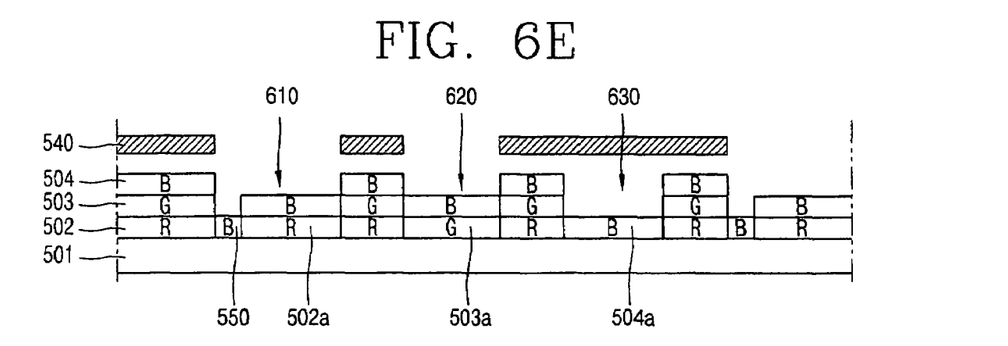

Then, as shown in FIG. 6E, a third photosensitive organic layer 504 (positive type) is deposited over the entire resultant structure where the first and second sub color filters 502a and 503a have been formed. Then, a third mask 540 for forming the third sub color filter layer 504a is applied and the exposure and development process similar to that for the first and second sub color filter layers 502a and 503a as discussed above is performed.

FIG. 7C shows a top plane view of an example of the mask 540. As shown in FIG. 7C, the mask 540 also includes the opening pattern 550' and first, second and third mask regions 610c, 620c and 630c which correspond respectively to the first, second and third color filter regions 610, 620 and 630 of the color filter layer 512. The first and second mask regions 610c and 620c are open or transmissive to pass a light therethrough.

Figure 6F:
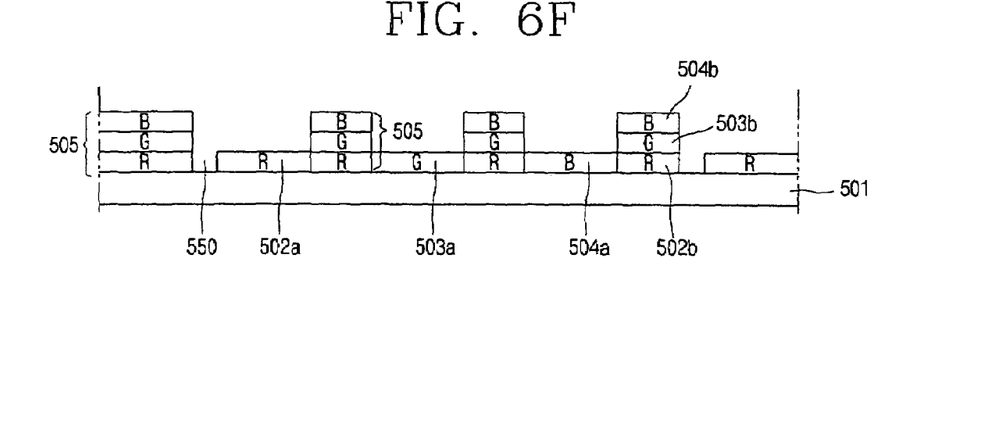

By the exposure and development, portions of the third organic layer 504 deposited in the openings 550 and at the first and second color filter regions 610 and 620 are completely removed, whereby the third organic layer 504 only at the third color filter region 630 and at the black matrix region remains as the third sub color filter layer 504a and a third black matrix part 504b. In the openings 550 used to form the spacer 509, no color filter layer is formed.

As a result, the first, second, and third sub color filter layers 502a, 503a and 504a are formed, and the first, second, and third organic layers are thickly stacked at the black matrix region as the first, second and third black matrix parts 502b, 503b and 504b. These black matrix parts 502b, 503b and 504b constitute the black matrix 505 for shielding any unnecessary light irradiated from the lower TFT array panel.

Figure 6G:
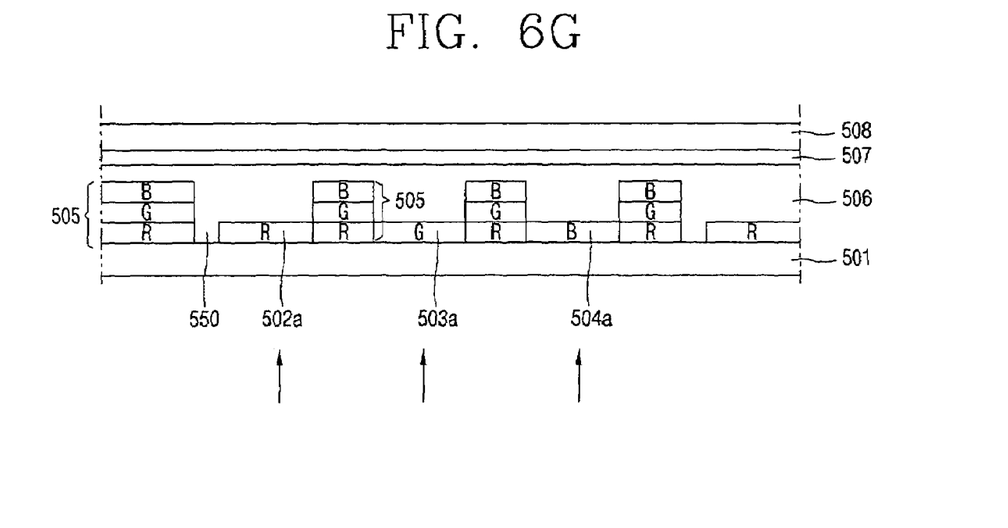

Then, as shown in FIG. 6G, since the black matrix 505 formed by stacking the first, second, and third organic layers has a large step, a transparent overcoat layer 506 for planarization is further formed on the resultant structure. The overcoat layer 506 fills the openings 550. A common electrode 507 formed of a transparent electrode such as indium tin oxide (ITO) or indium zinc oxide (IZO) for applying an electric field to the liquid crystal is further formed on the overcoat layer 506. Even though the common electrode 507 is needed in a twisted nematic (TN) mode operation for vertically applying the electric field to the liquid crystal between the upper and lower plates, it may not be necessary in an in-plane switching (IPS) mode operation where a common electrode is formed in the TFT array panel having pixel electrodes. In case of the IPS mode color filter panel, a static-electricity-preventing ITO layer may be formed at the rear surface or the inner surface of the upper and lower substrate in order to protect the substrates from the external static electricity and then a color filter layer forming process may be performed. In the IPS mode color filter panel, the common electrode 507 is not provided.

Next, an organic layer (photosensitve resin) 508 for forming the spacer 509 is deposited on the common electrode 507 (or on the overcoat layer 506 if the common electrode 507 is not present). After depositing the organic layer 508, the back surface of the color filter panel of the illustrated embodiment where the openings 550 have been formed is exposed to light, to back-expose the organic layer 508. In one example, the color filter layer 512 can include therein an ultraviolet ray absorbent material/layer such that even if the light impinges on other parts of the panel, the ray is absorbed by the color filter layer 512 and does not pass through the color filter layer 512. Accordingly, the photosensitive resin 508 is back-exposed only through the openings 550 to form the spacer 509 above the openings 550. The exposed parts of the organic layer 508 are hardened into a spacer pattern, and the rest of the organic layer 508 is removed at the development process. In this example, the organic layer 508 is a negative type photosensitive layer which hardened upon light exposure, but can be of other type. The spacer 509 may be formed of a colored organic layer capable of shielding the light in order to prevent the light from being leaked through the openings 550.

Figure 6H:
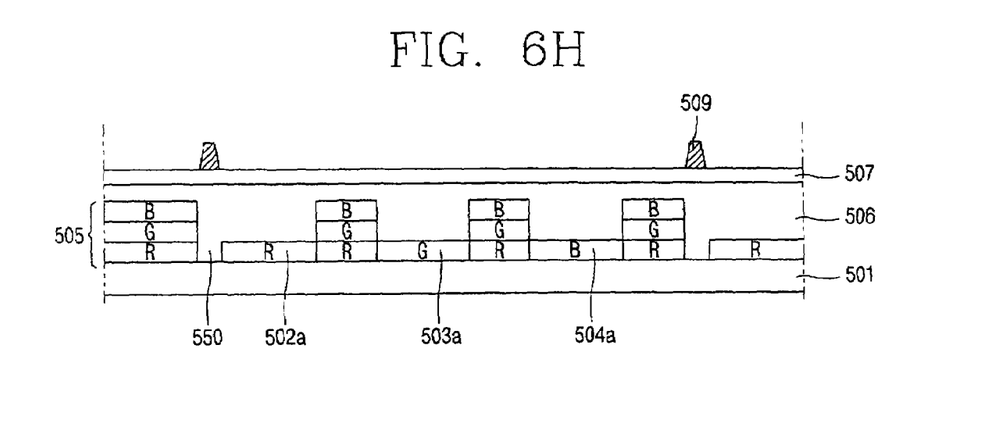

FIG. 6H shows an example of the spacer 509 formed by the above-discussed back exposure. According to the fabrication process of the color filter panel of the present invention, the spacer 509 is formed through the openings 550 and the back exposure without using an additional mask process, thereby simplifying the entire fabrication process.

Figure 6I:
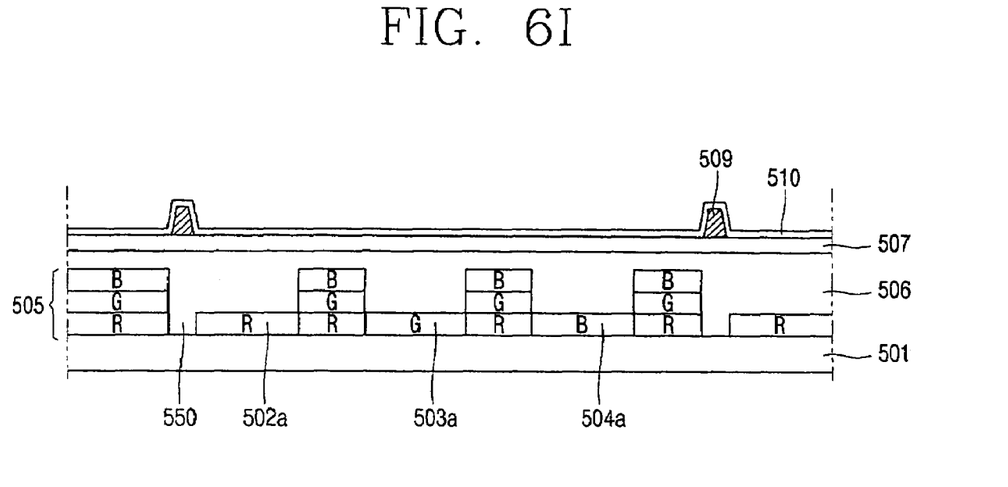

After forming the spacer 509, as shown in FIG. 6I, an alignment layer 510 for the initial alignment of the liquid crystal is formed on the spacer 509. The alignment layer 510 is formed by depositing an organic layer such as polyimide and by rubbing the organic layer in a certain direction by cotton or other suitable material/element. This completes the formation of the color filter panel according to the present invention.

Then the color filter panel undergoes an attaching process with the TFT array panel formed by an additional process, a cutting process, and a liquid crystal injection process, whereby the liquid crystal display panel of the LCD device is formed. It is understood that the present LCD device mentioned in connection with FIGS. 4-7C include elements generally present in related art LCD devices. For example, the present LCD device includes the related art TFT array panel such as one shown in FIG. 1, a liquid crystal layer between the TFT array panel and the present color filter panel, driving circuits, etc.

As aforementioned, in the fabrication process of the color filter panel, an opening to form a spacer as well as a black matrix composed of sub color filter layers are formed in the process of forming the color filter layer, and the back exposure is performed through the opening to form the spacer. Therefore, additional masks generally needed to form the opening and/or spacer and/or black matrix are not needed. This simplifies greatly the fabrication process, reduces the product cost, and increases the productivity.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A fabrication method for a color filter panel of a display device, the method comprising:
   forming a color filter layer on a substrate, the color filter layer defining an opening;
   forming a photosensitive layer on the color filter layer; and
   forming a spacer spaced apart from the color filter layer by back-exposing the photosensitive layer through the opening and removing an unexposed portion of the photosensitive layer, the spacer aligned with the opening in a direction of the back-exposing,
   the opening located in a region of the color filter panel corresponding to a corner region of a unit pixel region of a corresponding TFT array panel.

2. The method of claim 1, wherein in the step of forming the color filter layer, the color filter layer includes first, second and third sub color filter layers.

3. The method of claim 2, further comprising:
   forming a black matrix between the first, second and third sub color filter layers as the first, second and third sub color filter layers are formed.

4. The method of claim 3, wherein the opening is automatically formed as the black matrix and the first, second and third sub color filter layers are formed.

5. The method of claim 3, wherein in the step of forming the black matrix, the black matrix is a stack of first, second and third organic layers being used to form the first, second and third sub color filter layers, and wherein the step of forming the color filter layer includes forming the each of the first, second and third sub color filter layers lower than the stack of first, second and third organic layers.

6. The method of claim 2, wherein the step of forming the color filter layer includes;
   forming a first organic layer on the substrate;
   exposing the first organic layer using a first mask; and
   developing the exposed first organic layer to form the first sub color filter layer and to define the opening.

7. The method of claim 6, wherein the step of forming the color filter layer further includes:
   forming a second organic layer entirely over a resultant structure; exposing the second organic layer using a second mask; and
   developing the exposed second organic layer to form the second sub color filter layer and to define the opening.

8. The method of claim 7, wherein the step of forming the color filter layer further includes:
   forming a third organic layer entirely over a resultant structure; exposing the third organic layer using a third mask; and
   developing the exposed third organic layer to form the third sub color filter layer and to define the opening.

9. The method of claim 8, wherein each of the first, second and third masks includes a pattern corresponding to the opening, such that this pattern is used to form the opening.

10. The method of claim 1, wherein in the step of forming the color filter layer, the color filter layer includes an ultraviolet ray absorbent material.

11. The method of claim 1, wherein the step of forming the spacer is performed using a glass filter.

12. The method of claim 11, wherein the glass filter blocks a wavelength of at least 360nm.

13. The method of claim 1, further comprising:
    forming a common electrode on the color filter layer; and
    forming an alignment layer on the common electrode and the spacer.

14. The method of claim 1, further comprising:
    forming an overcoat layer on the color filter layer; and
    forming an alignment layer on the spacer.

15. The method of claim 1, wherein the spacer is formed by using a negative type photosensitive resin.

16. The method of claim 1, wherein the step of forming the spacer includes forming the spacer entirely outside of the opening.

17. The method of claim 1, wherein the step of forming the spacer includes forming the spacer spaced apart from the substrate.

18. The method of claim 1, wherein the step of forming the color filter layer includes forming a plurality of sub color filter layers such that the opening is between one of the sub color filter layers and a black matrix, and the opening is separated by the black matrix from another one of the sub color filter layers immediately adjacent to the one of the sub color filter layers.

19. A fabrication method for a color filter panel of a display device, the method comprising:
    forming a color filter layer on a substrate, the color filter layer having an opening, by sequentially forming first, second and third sub color filter layers;
    forming the opening in the color filter layer and a black matrix on the substrate as the first, second and third sub color filter layers are formed by sequentially masking and etching a respective one of the first, second and third sub color filter layers;
    forming an overcoat layer on the black matrix and the color filter layer;
    forming a common electrode layer on the overcoat layer;
    forming a photosensitive layer on the common electrode layer; and
    forming a spacer in the photosensitive layer by back-exposing the photosensitive layer through the opening and removing an unexposed portion of the photosensitive layer, wherein the opening is located in a region of the color filter panel corresponding to a corner region of a unit pixel region of a corresponding TFT array panel.

* * * * *